United States Patent [19]

Daniels et al.

[11] 3,916,224

[45] Oct. 28, 1975

[54] TRANSISTOR SWITCHING REGULATOR CONTROL UTILIZING CHARGING OF BOOTSTRAP CIRCUIT TO PROVIDE RAMP-UP

[75] Inventors: Richard Joseph Daniels, West Hurley; Anthony Joseph Mennella, Saugerties, both of N.Y.

[73] Assignee: International Business Machines Corporation, Armonk, N.Y.

[22] Filed: Aug. 2, 1973

[21] Appl. No.: 385,119

[52] U.S. Cl. ................ 307/265; 307/228; 307/246; 328/58; 328/181; 331/61; 332/9 R

[51] Int. Cl.²... H03K 5/04; H03K 4/08; H03K 7/00

[58] Field of Search.................... 307/228, 265, 246; 328/181, 58; 332/9 R; 331/60, 61

[56] References Cited

UNITED STATES PATENTS

| | | | |
|---|---|---|---|
| 2,898,481 | 8/1959 | Gahwiler | 307/228 |
| 3,048,714 | 8/1962 | Poole | 307/228 |
| 3,211,926 | 10/1965 | Frysinger | 328/58 |
| 3,740,588 | 6/1973 | Stratton et al. | 307/265 |
| 3,745,408 | 7/1973 | Emmons | 332/9 R |

*Primary Examiner*—Stanley D. Miller, Jr.

[57] ABSTRACT

A transistor switching regulator having a pulse width control which includes a minimum pulse output, a "ramp-up" start pulse output and a feedback controlled running pulse output sequenced to start up and run the transistor switching regulator in a controlled manner. The three pulse outputs are derived from an emitter coupled astable multivibrator having a linearizing boot strap circuit, coupled to one of its emitter output circuits and having a long time constant for gradually charging the capacitor of the boot strap circuit during the ramp-up operation. A circuit which is sensitive to the boot strap circuit during the charging of its capacitor provides a sequence of pulses of gradually increasing width during the ramp-up operation.

7 Claims, 4 Drawing Figures

TRANSISTOR SWITCHING REGULATOR CONTROL UTILIZING CHARGING OF BOOTSTRAP CIRCUIT TO PROVIDE RAMP-UP

BACKGROUND OF THE INVENTION

1. Field of the Invention

This invention relates to pulse circuits and more particularly to an improved pulse width control for a transistor switching regulator.

2. Prior Art

Many transistor switching regulators have pulse width control means for the transistor switching means which yield a series of control pulses of gradually increasing width, followed by control pulses the width of which are determined by a feedback circuit or the like, whereby the transistor switching regulator begins operation slowly so as to limit inrush currents and then passes into a running mode in which the on-times of the transistor switching means are controlled in a manner to yield the desired output of the regulator.

The prior art includes many examples of such circuits, which may include such elements as free-running multivibrators, controlled multivibrators, ramp-compare circuits, and/or controllable monostable multivibrators, relaxation oscillators or the like. In order to achieve the desired sequence of events, a number of such circuits are frequently coupled together, resulting in an overall pulse width control circuit configuration which may be bulky, costly, and subject to failure.

SUMMARY OF THE INVENTION

According to one aspect of the present invention, a transistor switching regulator is provided which has a pulse width control circuit employing a multivibrator which provides a clock output, a ramp-up pulse output and a compare ramp output, in a unitary circuit.

According to another aspect of the invention, an emitter coupled astable multivibrator is provided with a boot strap circuit across one of its emitter loads for providing a linear ramp signal for comparison with a control level to yield a running pulse width control.

In accordance with another object of the invention, the aforesaid boot strap circuit includes a boot strap capacitor which provides the circuit with a long time constant whereby it charges to stable operation gradually, and means are provided which are responsive to the gradually increasing boot strap operation of such circuits during the charging transient, to provide a sequence of pulses of gradually increasing width for ramp-up operation of a transistor switching regulator employing the circuit.

In accordance with another aspect of the invention, the multiple outputs of the unitary pulse source circuit are sequenced by simple logical means for bringing the transistor switching regulator into controlled operation.

Accordingly, it is an object of the invention to provide an improved pulse width control for a transistor switching regulator.

It is another object of the invention to provide an improved control as aforesaid characterized by a minimum of circuitry, and more particularly, by a minimum of such elements as capacitors which do not yield themselves easily to monolithic integration.

Another object is to provide an improved pulse width control as aforesaid characterized by multi-use of circuitry so as to enable compact and unitary packaging of the circuits for low cost and high reliability.

Still another object of the invention is to provide an improved transistor switching regulator characterized by an improved pulse width control as aforesaid.

The foregoing and other objects, features and advantages of the present invention will be apparent from the following description of a preferred embodiment of the invention as illustrated in the accompanying drawings.

DETAILED DESCRIPTION

Figure 1:
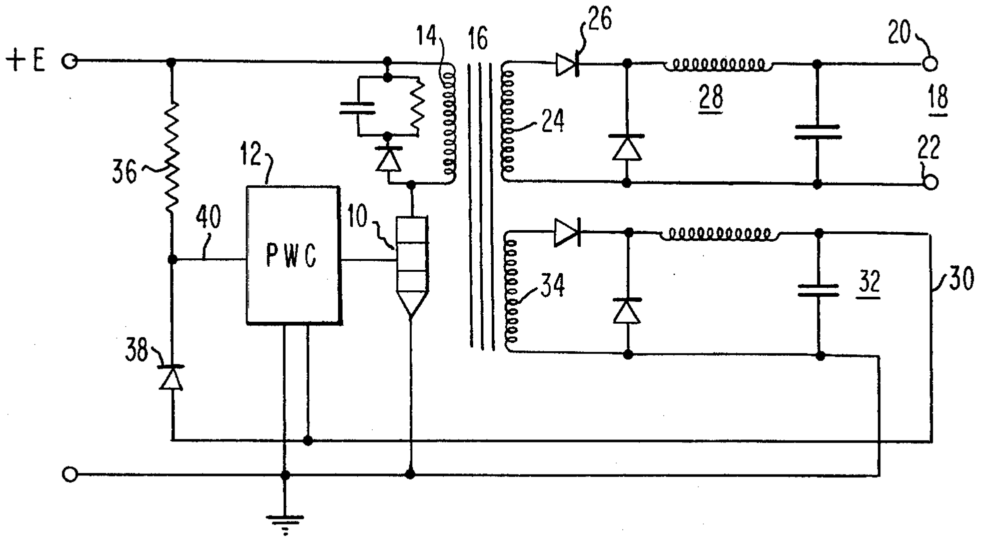
FIG. 1 is a simplified schematic drawing of a transistor switching regulator such as may employ the improved pulse width control of the invention.

FIG. 1 shows in outline form a typical transistor switching regulator having a transistor switch 10 which is controlled in on-off fashion by pulse width control 12 to pass current from a source +E through a primary winding 14 of a transformer 16. The regulator has one or more outputs such as output 18 having terminals 20, 22 for connection to a useful load, and powered by a secondary winding 24 of the transformer 16. For a DC output, the circuit 18 may include a rectifier 26 and filter 28 for smoothing the pulse-form output of the transformer.

The pulse width control 12 may be operated in accordance with a feedback signal on line 30 derived, for DC isolation, from a sense circuit 32 powered by a separate secondary winding 34 on transformer 16. Power for the pulse width control 12 may be derived initially from supply +E through a resistor 36, and later, when the regulator is operating and a controlled potential appears on line 30, the pulse width control may be supplied with power primarily through a diode 38, the resistor 36 and the diode 38 acting automatically to switch over the logic current supply during startup.

FIG. 1 is shown for illustrative purposes only, to show a setting in which the pulse width control circuits of the invention find particular utility, and it will be understood that any of many different kinds of transistor switching regulators, power inverters and the like can employ features of the control circuits of the invention.

Figure 2:
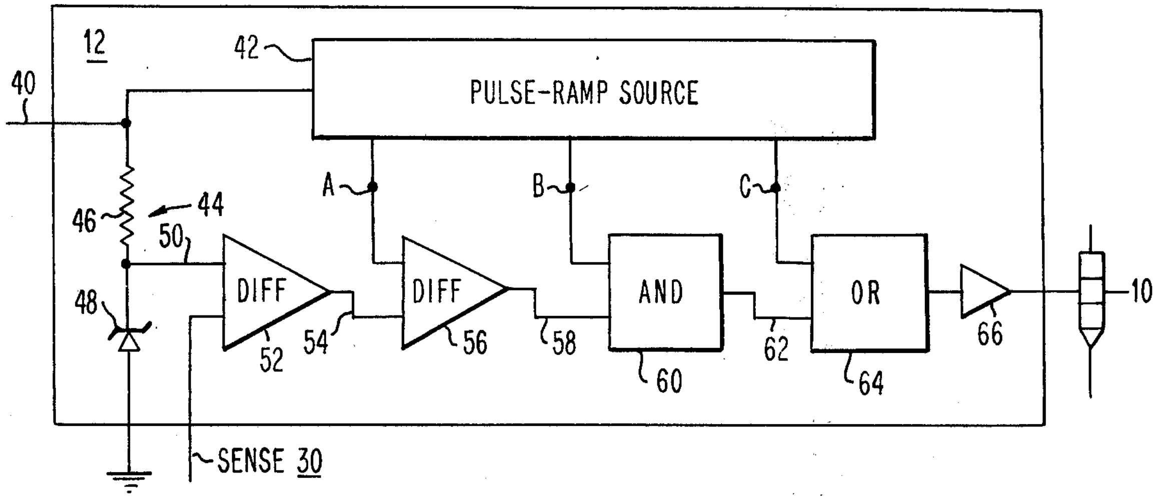
FIG. 2 is a schematic diagram of a portion of the pulse width control of the circuit of FIG. 1.

FIG. 2 shows in simplified form a logical arrangement for providing start pulses, ramp-up pulses, and controlled running pulses in the pulse width control 12 of FIG. 1. Logic bias power is provided via line 40 to the various control circuits including a pulse-ramp source 42 which will be described in greater detail hereinafter, and a reference 44 which may comprise a resistor 46 and a zener diode 48. Circuit 44 provides a reference potential on line 50 which is compared with the feedback signal on line 30 in a differential amplifier 52 to provide a difference level on line 54. This level is compared with a ramp signal provided by terminal A of pulse-ramp source 42 in a second differential amplifier 56.

As will be explained hereinafter, the signal at terminal A is, once the regulator is in full operation, a recurrent ramp or sawtooth waveform. Unlike amplifier 52, differential amplifier 56 saturates so its output on line 58 is a binary signal.

For example, the sawtooth or ramp at terminal A may have a negative slope, and when the value of the potential on line A falls through the control level on line 54, the output of the differential amplifier on line 58 may rise abruptly from a lower level to an upper level. Since the sawtooth waveform at terminal A is recurrent, the resulting signal on line 58 will be a square wave pulse train in which the rise time in each cycle is variable according to the level of the control signal on line 54.

In accordance with the invention, pulse-ramp source 42 has another output, at terminal B, in the form of a series of pulses which starts with very narrow pulses when the circuit is first turned on, followed by pulses of gradually increasing width to "ramp-up" the regulator of FIG. 1 into full operation.

To provide the desired sequence of control, the pulses at terminal B are combined in a logical AND circuit 60 so that the output on line 62 of AND circuit 60 is a train of pulses corresponding to the narrower of the pulses on line 58 and at terminal B. For example, AND circuit 60 may comprise a pair of transistors in series, one of which is controlled by the signals at terminal B and the other of which is controlled by the signals on line 58, so that the output on line 62, through the transistors in series, is present only during the concurrence of the two inputs.

A third terminal, terminal C, of pulse-ramp source 42 provides a series of very thin, constant width pulses which are fed along with the signals on line 62 via OR circuit 64 to a driver amplifier 66 for the base circuit of switching transistor 10 which, in the illustrated embodiment of FIG. 1, is the main transistor switch of the regulator. As will become apparent hereinafter, the signals at terminals A, B and C of source 42 are all in synchronism, being derived from a single multivibrator, so that the thin pulses supplied by terminal C fall within and are useful only in the absence of pulses on line 62. In like manner, pulses at terminal B control AND circuit 60 only during the start up operation of the circuit when the operative pulses at terminal B are narrower than those produced on line 58 in response to the signals at terminal A and on line 54.

Figure 3:
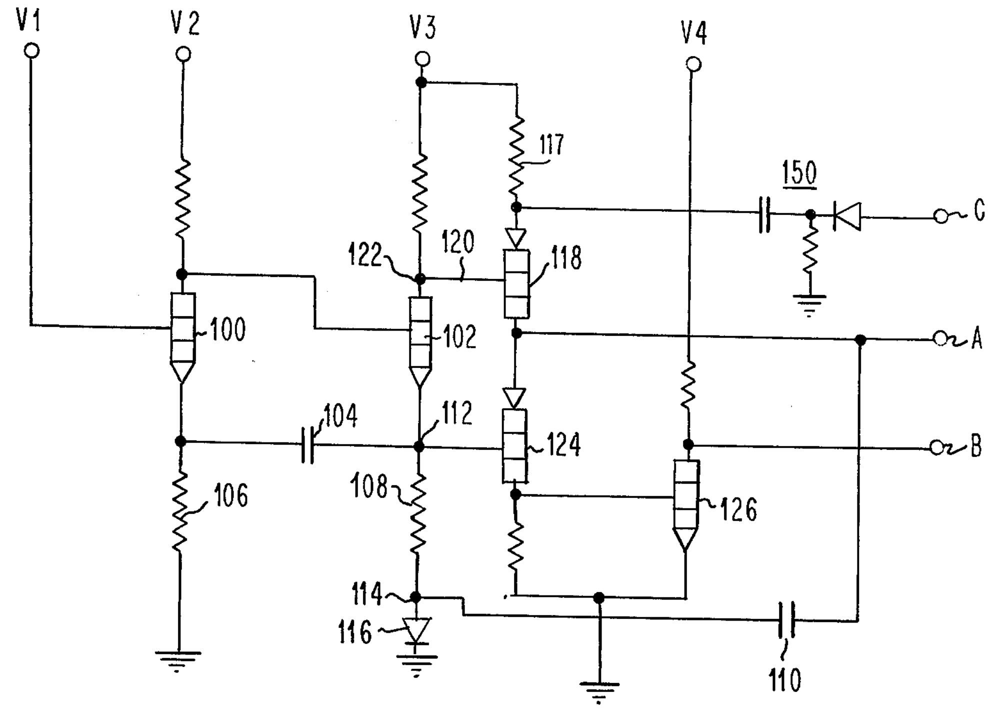
FIG. 3 is a simplified circuit diagram of a multifunction multivibrator — bootstrap circuit suitable for inclusion in the pulse width control of FIG. 1, for cooperation with logical elements of the pulse width control as shown in FIG. 3.

FIG. 3 is illustrative of suitable circuitry for the pulse-ramp source 42 of FIG. 2. In the illustrated embodiment, a basic clock function is provided by an emitter coupled multivibrator comprising a pair of switching transistors 100, 102, a coupling and timing capacitor 104 and emitter load resistors 106, 108. Circuits of this kind are well known and are discussed, for example, in Section 11-14 of "Pulse, Digital, and Switching Waveforms" by Millman and Taub, McGraw Hill Book Co., Library of Congress Catalog Card No. 64–66293, Pages 445–451. Accordingly, this circuit is shown in a simplified form such as that of FIG. 11–29 of the cited work, but it will be understood that this is for illustrative purposes and various practical modifications and embellishments can be made readily by those skilled in the art.

The output across an emitter resistor of a multivibrator of this kind is a repetitive waveform provided by the RC transient of the charge on a timing capacitor, such as the capacitor 104 of the circuit of FIG. 3. If the supply voltages V1, V2 and V3 are relatively low, this output will comprise a substantial portion of a typical RC transient curve and therefore will not be linear.

As usual, in an emitter coupled oscillator as shown, V1 is smaller than V2, which is smaller than V3. Output logic level supply +V4 may be any convenient value, to provide the desired output magnitude terminal B. These voltages may be derived from logic power line 40 in any convenient manner.

In accordance with the invention, a "bootstrap" circuit is provided to linearize the signal at 112 at the emitter of transistor 102 of the circuit of FIG. 3. A capacitor 110 is provided which, when charged, effectively fixes the potential difference between terminals 112 and 114 at the opposite ends of multivibrator emitter resistor 108. An isolating diode 116 permits terminal 114, which in an ordinary emitter coupled multivibrator might be connected to ground, to vary with respect to ground as the potential at terminal 112 varies during cyclic operation of the multivibrator. Bootstrap circuits are not, per se, new, and are discussed for example in Section 14–15, page 558 et seq of the cited Millman and Taub work.

It is a feature of the present invention, however, that the bootstrap capacitor 110 is charged initially through a resistor 117 under the control of a switching transistor 118, with the value of the time constant of resistor 117-capacitor 110 combination being long. For example, the value of capacitor 110 may be in the order of two magnitudes greater than would be required for its steady state bootstrap operation alone. Transistor 118 is controlled by a base drive connection 120 from terminal 122 in the collector circuit output of the multivibrator, so that the charging current through resistor 117 and transistor 118 to bootstrap capacitor 110 is admitted in pulses, one pulse for each oscillation of the multivibrator. Accordingly, when the circuit is first turned on, the charge across capacitor 110 rises slowly over a period of many oscillations of the multivibrator.

When the system is first turned on, such as by initial application of supply voltage +E, FIG. 1, the appearance of logic supply voltage on line 40 initiates operation of the oscillator. At this time, the voltage across the bootstrap capacitor 110 is zero. Therefore, transistor 124 is held in off condition and the oscillator runs in its normal mode with an exponential voltage decay at the emitter of transistor 102. Each time oscillator transistor 102 turns on it operates via 120 to turn on bootstrap charging transistor 118 and adds an increment of charge to the bootstrap capacitor 110. Accordingly, the potential at the emitter of transistor 124 rises in step fashion, to the point where transistor 124 will start turning on at the lowest point of the exponential wave form of terminal 112, at the emitter of oscillator transistor 102. This, in turn, will provide drive to output transistor 126, the collector of which is connected to terminal B of the circuit. The on time of transistor 124 and thus of transistor 126 will be a minimum at the start and will rise slowly as the charge on capacitor 110 intercepts the transient terminal 112 at higher and higher levels, that is, earlier and earlier in the oscillator cycle. In other words, as the voltage at the emitter of transistor 124 continues to rise, the bootstrap circuit will be on for longer and longer periods of the exponential decay and the pulse width at output terminal B will increase at the same time as the decay transient at terminal 112 is being linearized.

Figure 4:
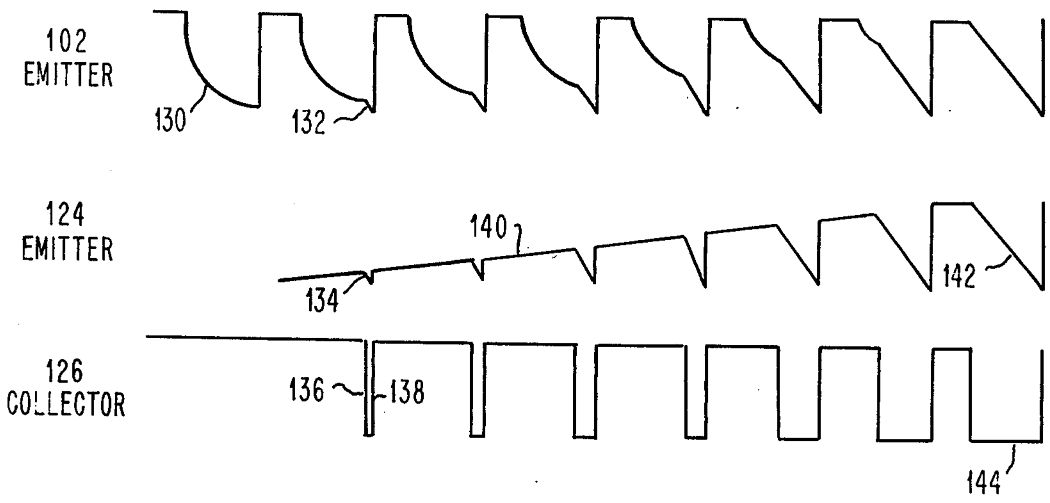
FIG. 4 shows a series of waveform diagrams illustrative of the operation of the circuit of FIG. 3.

FIG. 4 shows this operation graphically. Initially, the potential at the emitter of transistor 102 is a typical RC curve 130. When the bootstrap circuit begins to operate, a portion of this curve is linearized as seen at 132 and a corresponding linear transient appears at the emitter of transistor 124, as seen at 134. Coincident with the beginning of the linear transient, transistor 126 is turned on as seen at 136, and when the oscillator switches transient 134 terminates and transistor 126 is turned off as seen at 138.

As the charge 140 on the bootstrap capacitor 110 continues to rise, the linearized sawtooth wave becomes longer and longer until a maximum, constant waveform is achieved, as seen at 142. At the same time the output pulses at terminal B at the collector of transistor 126 become longer and longer until a limiting width is achieved as seen at 144.

A third output, at terminal C, is provided from the oscillator, this output consisting of a sliver pulse derived by differentiating circuit 150 each time transistor 118 is turned on by the switching of the oscillator.

Since all of the signals at terminals A, B and C are provided by the same oscillator, they are fully synchronized and have the coincident relationship required for proper operation of the logical circuit of FIG. 2.

Accordingly, when power is first applied the signals from terminal C operate to deliver sliver pulses to the base of switching transistor 10, initiating operation of the regulator. As the potential on boot strap capacitor 110 rises, the pulses delivered by terminal B commence and gradually increase in width whereby enough power is delivered by transformer 16 to sense circuit 32 to commence charging of the filter capacitor of that circuit so that the level on feedback line 30 gradually rises. When this level rises to the vicinity of the reference level provided by zener 48, the resulting control level on line 54 coacts in differential amplifier 56 with the ramp which by now is established at terminal A to provide control pulses on line 58. As the level on sense line 30 increases further, the duration of each pulse on line 58 decreases. At the same time, the pulse width at terminal B are increasing. At some point in time the pulse width on line 58 becomes narrower than those at terminal B and therefore become controlling as to the output of AND circuit 60. The start-up operation of the regulator is complete.

The bootstrap circuit is comprised of transistor 124, bootstrap capacitor 110, transistor 118, resistor 117 and diode 116. During normal operation, transistor 124 provides the high impedance isolation to terminal 112. Capacitor 110 is very large compared to capacitor 104 and, therefore, provides a very nearly constant voltage across resistor 108 during oscillator period, in turn providing constant current discharge of capacitor 104. Transistor 118, resistor 117 and diode 116 provide the low impedance, fast recharge of capacitor 110 between each sawtooth while providing a very high isolation impedance during sawtooth thus maximizing the bootstrap efficiency.

While the invention has been particularly shown and described with reference to a preferred embodiment thereof, it will be understood by those skilled in the art that various changes in form and detail may be made therein without departing from the spirit and scope of the invention.

What is claimed is:

1. A pulse width control circuit for a transistor switching regulator comprising, an oscillator having circuit means assuming first and second states as said oscillator switches between corresponding astable states, a bootstrap circuit comprising a storage capacitor and a charging circuit therefor comprising a resistor, the charging time constant of said bootstrap circuit being long compared to the period of oscillation of said oscillator, said oscillator including means providing a transient output during one of said states, and second circuit means connected to be responsive to said transient output and to the charge level on said storage capacitor to initiate an output pulse, and to terminate said pulse by and upon the resetting of said transient by switching action of said oscillator, thereby providing a first output pulse train of increasing pulse width, said second circuit means including a discharging circuit for said storage capacitor comprising a switch and a second resistor connected to be responsive to said transient output and the charge on said storage capacitor to provide a linearized output corresponding to said transient, thereby providing a second output ramp train which increases in amplitude as said storage capacitor charges.

2. Apparatus in accordance with claim 1 further including a differentiating circuit coupled to said oscillator to be responsive thereto to provide a third output comprising a series of constant width sliver pulses in synchronism with said first and second outputs.

3. Apparatus in accordance with claim 2 wherein said oscillator is an emitter coupled transistor multivibrator comprising a pair of switching transistors having emitters, a timing capacitor connected between said emitters, and an emitter load impedance connected in series with one of said emitters, said bootstrap circuit comprising an isolating transistor having an emitter-base junction connected in series with said load across said storage capacitor, said second output ramp train being taken at the emitter of said isolating transistor.

4. Apparatus in accordance with claim 3 wherein said first output is responsive to the switching of said isolating transistor.

5. Apparatus in accordance with claim 4 wherein said charging circuit of said storage capacitor includes a switch responsive to said oscillator to admit pulses of charge to said capacitor in synchronism with oscillation of said oscillator.

6. Apparatus in accordance with claim 5 further including a logical sequencing circuit combining said first, second and third outputs with a feedback control output of an associated transistor switching regulator for rendering said third, first and second outputs effective in sequence to provide sliver pulses, then increasing width pulses and finally feedback controlled width pulses as the transistor switching regulator ramps up into operation.

7. Apparatus in accordance with claim 6 wherein, said sequencing circuit comprises, a comparator circuit fed by said second output and a feedback difference circuit of said regulator, a logical AND circuit fed by the output of said comparator circuit and said first output, and a logical OR circuit fed by the output of said AND circuit and said third output.

* * * * *